(12) United States Patent
Ferrotti et al.

(10) Patent No.: US 10,511,147 B2
(45) Date of Patent: *Dec. 17, 2019

(54) LASER DEVICE AND PROCESS FOR FABRICATING SUCH A LASER DEVICE

(71) Applicants: Commissariat A L'Energie Atomique et aux Energies Alternatives, Paris (FR); STMICROELECTRONICS SA, Montrouge (FR); STMICROELECTRONICS (CROLLES 2) SAS, Crolles (FR)

(72) Inventors: Thomas Ferrotti, Grenoble (FR); Badhise Ben Bakir, Brezins (FR); Alain Chantre, Seyssins (FR); Sebastien Cremer, Sassenage (FR); Helene Duprez, Seyssinet-Pariset (FR)

(73) Assignees: Commissariat A L'Energie Atomique et aux Energies Alternatives, Paris (FR); STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/992,573

(22) Filed: May 30, 2018

(65) Prior Publication Data
US 2018/0278021 A1 Sep. 27, 2018

Related U.S. Application Data

(63) Continuation of application No. 14/827,429, filed on Aug. 17, 2015, now Pat. No. 10,014,660.

(30) Foreign Application Priority Data

Aug. 22, 2014 (FR) ...................... 14 57937

(51) Int. Cl.
*H01S 5/125* (2006.01)
*H01S 5/12* (2006.01)
(Continued)

(52) U.S. Cl.
CPC ............ *H01S 5/1237* (2013.01); *H01S 5/021* (2013.01); *H01S 5/026* (2013.01); *H01S 5/1032* (2013.01);
(Continued)

(58) Field of Classification Search
CPC ... H01S 5/021; H01S 5/1028; H01S 5/12-125
See application file for complete search history.

(56) References Cited

U.S. PATENT DOCUMENTS 9,509,122 B1 11/2016 Norberg
10,014,660 B2 * 7/2018 Ferrotti ................. H01S 5/1237
(Continued)

FOREIGN PATENT DOCUMENTS

FR 11/00611 11/2011

OTHER PUBLICATIONS

Preliminary Search Report and Written Opinion on Patentability dated Jun. 29, 2015 in French Patent Application No. FR1457937 (with English translation of Category of Cited Documents).
(Continued)

*Primary Examiner* — Tod T Van Roy
(74) *Attorney, Agent, or Firm* — Oblon, McClelland, Maier & Neustadt, L.L.P.

(57) ABSTRACT

The invention relates to a III-V heterostructure laser device (1) arranged in and/or on silicon, comprising:
 a III-V heterostructure gain medium (3); and
 an optical rib waveguide (11), arranged facing the gain medium (3) and comprising a slab waveguide (15) equipped with a longitudinal rib (17), the optical rib waveguide (11) being arranged in the silicon.
(Continued)

The optical rib waveguide (11) is oriented so that at least one Bragg grating (19, 19a, 19b) is arranged on that side (21) of the slab waveguide (15) which is proximal relative to the gain medium (3) and in that the rib (17) is placed on that side (23) of the slab waveguide (15) that is distal relative to the gain medium (3).

11 Claims, 9 Drawing Sheets

(51) Int. Cl.
| | | |
|---|---|---|
| *H01S 5/02* | (2006.01) | |
| *H01S 5/026* | (2006.01) | |
| *H01S 5/10* | (2006.01) | |
| *H01S 5/343* | (2006.01) | |
| *H01S 5/022* | (2006.01) | |
| *H01S 5/042* | (2006.01) | |
| *H01S 5/187* | (2006.01) | |
| *H01S 5/323* | (2006.01) | |
| *G02B 6/12* | (2006.01) | |
| *G02B 6/30* | (2006.01) | |
| *G02B 6/34* | (2006.01) | |

(52) U.S. Cl.
CPC ............ *H01S 5/1231* (2013.01); *H01S 5/343* (2013.01); *G02B 6/30* (2013.01); *G02B 6/34* (2013.01); *G02B 2006/12061* (2013.01); *G02B 2006/12121* (2013.01); *H01L 2224/32* (2013.01); *H01S 5/0215* (2013.01); *H01S 5/02284* (2013.01); *H01S 5/0421* (2013.01); *H01S 5/1014* (2013.01); *H01S 5/187* (2013.01); *H01S 5/323* (2013.01); *H01S 2301/166* (2013.01)

(56) References Cited

U.S. PATENT DOCUMENTS

| | | |
|---|---|---|
| 2009/0154517 A1 | 6/2009 | Leem |
| 2010/0208756 A1 | 8/2010 | Noh |
| 2013/0259077 A1 | 10/2013 | Ben Bakir et al. |
| 2015/0270684 A1 | 9/2015 | Suzuki |

OTHER PUBLICATIONS

B. Ben Bakir, et al., "Electrically driven hybrid Si/III-V lasers based on adiabatic mode transformers" Proceedings of SPIE, vol. 7719, XP055000619, May 17, 2010, pp. 77191F-1-77191F-9.

Preliminary Search Report and Written Opinion on Patentability issued Jun. 29, 2015 in French Patent Application No. FR1457937 (with English translation of Category of Cited Documents).

Stevan Stankovic, et al., "Hybrid III-V/Si Distributed-Feedback Laser Based on Adhesive Bonding" IEEE Photonics Technology Letters, vol. 24, No. 23, XP011488545, Dec. 2012, pp. 2155-2158.

B. Ben Bakir, et al., "Electrically driven hybrid Si/III-V lasers based on adiabatic mode transformers" Proceedings of SPIE, vol. 7719, XP055000619, May 17, 2010, Pages 77191F-1-77191F-9.

\* cited by examiner

LASER DEVICE AND PROCESS FOR FABRICATING SUCH A LASER DEVICE

CROSS-REFERENCE TO RELATED APPLICATIONS

This application is a continuation of and claims the benefit of priority under 35 U.S.C. § 120 from U.S. application Ser. No. 14/827,429 filed Aug. 17, 2015, the entire contents of which are incorporated herein by reference.

TECHNICAL FIELD

The present invention relates to the field of integrated photonic components that use both the properties of semiconductors able to emit light and those of semiconductors conventionally used in integrated circuits.

More particularly, the present invention relates to a laser device and to a process for fabricating such a laser device.

Such a laser device may be employed to produce high-speed optical links, interchip and interboard links and links over free space.

PRIOR ART

Document "Hybrid silicon evanescent laser fabricated with a silicon waveguide and III-V offset quantum wells" Hyundai Park et al. 2909491 4 Optics Express, vol. 13, N 23, 14 Nov. 2005, pages 9460-9464, describes a laser source made of III-V material added to an SOI substrate in which a rib waveguide is produced formed from a slab waveguide surmounted with a rib.

The coupling between the laser source and the waveguide is by evanescent wave. Mirrors bounding the cavity are produced by sawing and polishing. The laser source and the waveguide are autonomous. The pumping of the gain cavity is optical. The drawback of this structure resides in the production of the mirrors, it is necessary to carry out a step of simultaneous sawing and polishing or "poli-sawing". The poli-sawing is very difficult to carry out, it is a question of a difficultly industrializable non-wafer-scale process.

A laser integrated into the same substrate as a modulator, an amplifier or a filter in which both a light-emitting structure and a diffraction grating are produced in III-V technology and placed end-to-end is also known from French patent application FR-A-2 826 789. Silicon technologies are not employed and the association of this optical component with a component in silicon technology would have the aforementioned drawbacks.

A laser comprising a III-V heterostructure amplifier arranged to generate photons and a rib waveguide optically coupled to the amplifier and comprising a ridge- or rib-shaped section the top of which is proximal to the amplifier is also known from document WO2012066200.

The central portion of the laser may be considered to be two vertically coupled guides separated by an oxide layer of about one hundred nanometres in thickness: an "active" upper waveguide that forms the gain medium (or amplifying medium), and a transparent lower waveguide or passive photonic circuit that serves to convey the light and in which all the optical functions are carried out. The active guide is defined in a doped III-V heterostructure in which quantum wells (or dots) are arranged.

The laser cavity is therefore defined by a Bragg mirror located under the laser and etched into the rib of the silicon guide.

The rib also has the function of acting as an adiabatic mode converter. For this purpose, from its smallest section, which is located under the gain medium, it gradually widens as far as the output waveguide.

For the distributed feedback (DFB) lasers of the aforementioned document, the desired reflectivity is located between 65 and 80%.

However, in the present case, for counterdirectional coupling, the reflectivity per unit length depends on the effective index difference between the etched and unetched zones of the grating (a grating etched more deeply will have a higher reflectivity per unit length), but also on the width of the latter.

However, in the context of a DFB laser, the width of the grating is set by the input width of the mode converter, i.e. the rib guide.

It turns out that a minimum width of 0.7 µm is necessary to obtain the desired reflectivity, whereas the starting width of a mode converter may be much smaller than this value (as low as 0.4 µm). In this case, it is necessary to carry out the mode conversion with a larger starting width, in order to obtain the required reflectivity (truncation of the mode converter). This operation will however decrease the confinement of the mode in the active guide, and decrease the efficiency of the laser. The limiting rib width at which mode conversion can begin is located at about 0.8 µm.

It will therefore be understood that for DFB lasers, it is difficult to obtain both a high reflectivity and efficient coupling between the active and passive guides.

The present invention aims to at least partially mitigate the aforementioned drawbacks by providing a laser device in which the reflectivity of the Bragg grating may be decoupled from the width of the rib of the rib waveguide.

For this purpose, the present invention provides a III-V heterostructure laser device arranged in and/or on silicon, comprising:

a III-V heterostructure gain medium; and an optical rib waveguide, arranged facing the gain medium and comprising a slab waveguide equipped with a longitudinal rib, the optical rib waveguide being arranged in the silicon;

wherein the optical rib waveguide is oriented so that at least one Bragg grating is arranged on that side of the slab waveguide which is proximal relative to the gain medium and in that the rib is placed on that side of the slab waveguide that is distal relative to the gain medium.

In particular, by decorrelating the width of the grating and the width of the rib, an additional degree of freedom is obtained: it is possible to produce a grating wider than the rib in order to improve reflectivity, and to keep a thin rib in order to optimize coupling.

The laser device may have one or more of the following aspects, whether alone or in combination:

According to one embodiment, the laser device comprises two Bragg gratings arranged on either side of the III-V heterostructure gain medium.

In this case, the Bragg grating that is located on the same side as an output grating for example possesses a reflectivity of about 50% and the Bragg grating on the side opposite the gain medium for example possesses a reflectivity higher than 90%.

According to another embodiment, the laser device comprises a Bragg grating facing the III-V heterostructure gain medium. In this case it is especially a question of a single Bragg grating.

In this case, the Bragg grating comprises a quarter-wave plate in order to ensure a single-mode operation.

For this embodiment, the reflectivity of the Bragg grating is comprised between 65% and 80%.

According to the following aspects, valid for either one of the embodiments:

the width of the Bragg grating is larger than that of the rib;
the width of the Bragg grating is substantially equal to the width of the slab waveguide;
the width of the rib of the rib waveguide increases in the direction of an output waveguide in order to form a mode converter;
the minimum width of the rib is comprised between 0.4 µm and 0.7 µm;
the maximum width of the rib is larger than 1 µm and especially 1.1 µm;
the height of the rib is comprised between 100 nm and 250 nm, in particular 200 nm;
the height of the slab guide is comprised between 250 nm and 350 nm, in particular 300 nm;
the slab waveguide and the longitudinal rib are each formed from crystalline silicon or one from crystalline silicon and the other from amorphous silicon; and
the longitudinal rib is made of crystalline silicon and the slab waveguide is formed by two layers, the layer making contact with the longitudinal rib also being made of crystalline silicon and the other, which is proximal to the gain medium, being made of amorphous silicon.

The invention also relates to a process for fabricating a laser device, especially such as defined above, comprising the following steps:

producing a rib waveguide comprising a slab waveguide equipped with a longitudinal rib in a silicon layer arranged above a buried insulating layer itself arranged above a carrier substrate;
encapsulating the rib waveguide with an insulating layer;
flipping the assembly;
removing the carrier substrate and the buried insulating layer until one side of the slab waveguide is exposed;
producing by etching at least one Bragg grating in the side of the slab waveguide;
depositing an insulating layer and carrying out a chemical-mechanical polish of this layer;
depositing a heterostructure formed from III-V semiconductors; and
carrying out a selective chemical etch of the heterostructure in order to obtain a gain medium.

The invention also relates to a process for fabricating a laser device, especially such as defined above, comprising the following steps:

producing a rib waveguide comprising a slab waveguide equipped with a longitudinal rib in a silicon layer arranged above a buried insulating layer itself arranged above a carrier substrate;
encapsulating the rib waveguide with an insulating layer;
flipping the assembly;
removing the carrier substrate and the buried insulating layer until one side of the slab waveguide is exposed;
depositing an amorphous silicon layer on the side of the slab waveguide;
producing by etching at least one Bragg grating in the amorphous silicon layer;
depositing an insulating layer and carrying out a chemical-mechanical polish of this layer;
depositing a heterostructure formed from III-V semiconductors; and
carrying out a selective chemical etch of the heterostructure in order to obtain a gain medium.

BRIEF DESCRIPTION OF THE DRAWINGS

Other advantages and features will become apparent on reading the description of the invention, and from the following figures in which.

DESCRIPTION OF EMBODIMENTS

In all the figures, identical elements have been given the same reference numbers.

In the present text, the term "longitudinal" must be understood to mean substantially parallel to the direction of propagation of the light (see arrow F1) and the term "transversal" must be understood to mean substantially transverse to the direction of propagation of the light.

Conventionally, in an optical circuit produced in a given plane, TE (for transverse electric) and TM (for transverse magnetic) polarisation states are defined such that in the TE state the electric field is parallel to the plane of the circuit, whereas the magnetic field is perpendicular to the plane of the circuit, and in the TM state the magnetic field is parallel to the plane of the circuit whereas the electric field is perpendicular to the plane of the circuit. In fact, in the laser it will be necessary implicitly to consider a quasi-TE polarisation state, i.e. the electric field is for the very most part polarised in its TE direction. Thus, the structure of the laser such as described will preferably allow coupling of the TE or quasi-TE mode of the wave.

FIGS. 1 to 4 show a first embodiment of a laser device 1 according to the invention. In this embodiment, it is a question of a doped III-V heterostructure distributed feedback laser device integrated into silicon.

Figure 1:
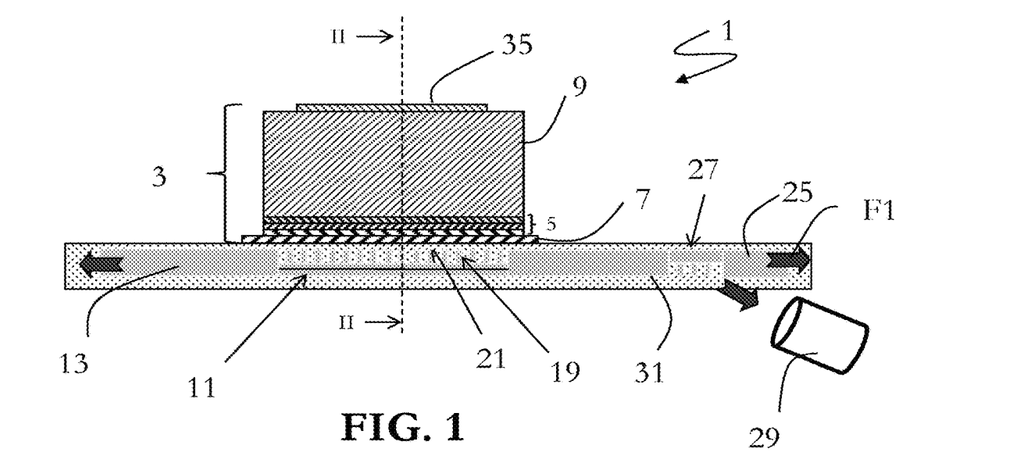
FIG. 1 shows a schematic longitudinal cross-sectional view of a first embodiment of a laser device according to the invention.
Figure 2:
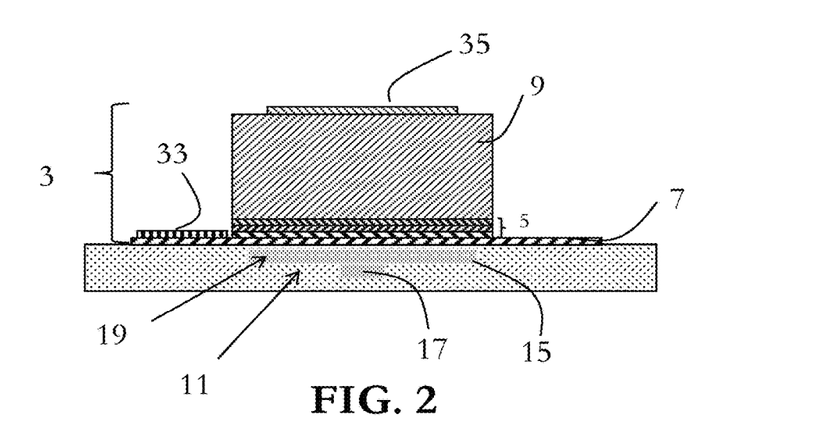
FIG. 2 shows a schematic transverse cross-sectional view along the cross section line II-II in FIG. 1 of the laser device in FIG. 1.
Figure 3A:
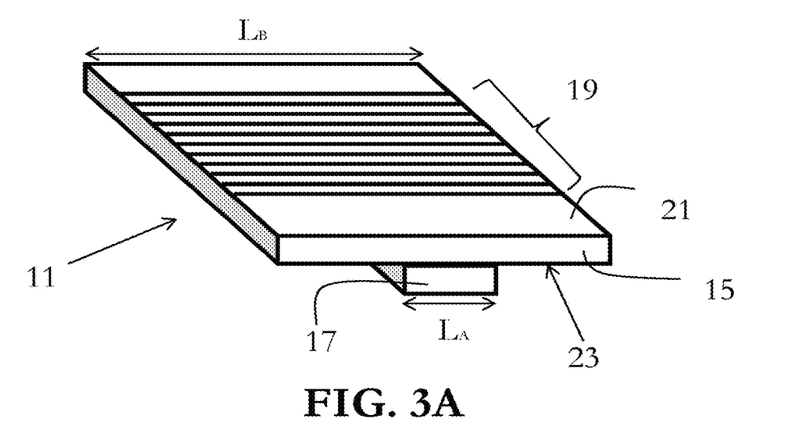
FIG. 3A shows a schematic perspective representation of the rib waveguide of the laser device in FIG. 1.
Figure 4:
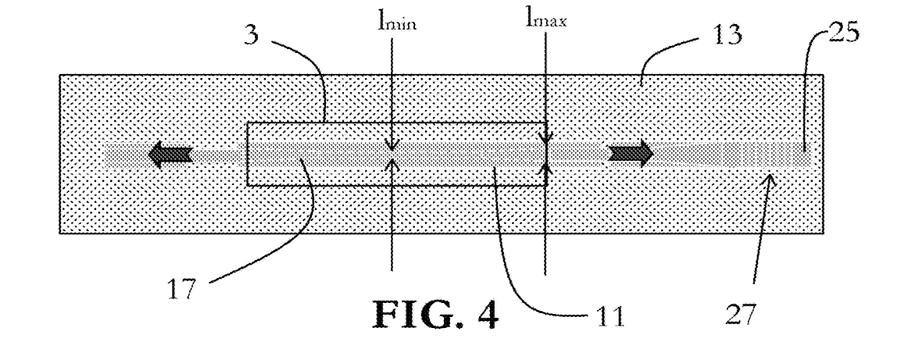
FIG. 4 shows a partial top view of the laser device in FIG. 1.

FIG. 1 is a schematic longitudinal cross-sectional view, FIG. 2 a transverse cross-sectional view along the cross section line II-II, FIG. 3A shows a schematic perspective representation of the rib waveguide of the laser device in FIG. 1 and FIG. 4 shows a partial top view of the laser device 1.

The laser device 1 comprises a III-V heterostructure optical gain medium 3, the heterostructure being arranged to generate photons or in other words an optical wave.

The expression "III-V heterostructure" is understood to mean the use of materials possibly chosen from the following nonexhaustive list: InP, GaAs, InGaAlAs, InGaAsP, AlGaAs and InAsP. The heterostructure of such a gain medium 3, also referred to as an amplifying medium, may comprise a stack of various layers, such as for example a layer stack 5 forming quantum wells sandwiched between a first doped layer 7, which is preferably n-doped, and a second doped layer 9, which is preferably p-doped.

Typically the layer 9 will be p-doped to $1 \times 10^{19}$ cm$^3$ and the layer 7 to $1 \times 10^{18}$ cm$^3$. More precisely, the layers 7 and 9 may themselves be formed by epitaxial growth and be composed of a plurality of variably doped sub-layers (dopant density increasing with distance from the quantum wells). The quantum wells are not doped.

The first doped layer 7, when it is n-doped, may comprise a material chosen, for the most part, from InP, GaAs, InGaAlAs, InGaAsP, AlGaAs and InAsP. The second doped layer 9, when it is p-doped, may comprise a material chosen from InP, GaAs, InGaAsP and InGaAlAs. In other words, the materials used for the first layer 7 and the second layer 9 may be the same, only the doping changing.

Of course, the doping may be inverted, i.e. the first doped layer 7 may be p-doped, and the second doped layer 9 may be n-doped. The layer stack 5 may comprise quantum wells or quantum dots allowing holes and electrons to recombine to form photons, and thus generate the optical wave in the gain medium 3. The quantum elements (wells or dots) may comprise a material such as InP, GaAs, InGaAlAs, InGaAsP, AlGa, As and InAsP.

The thickness of the heterostructure gain medium 3 is typically about a few microns.

The thickness of the stack 5 of quantum wells is about 200-400 nm, for example 300 nm, and the thickness of the layer 7 is about 100-200 nm. The layer 9 may have a thickness comprised between 1-3 µm.

As is shown in FIGS. 1 and 2, under the gain medium 3 is arranged an optical rib waveguide 11 integrated into or formed in a silicon-on-insulator (SOI) layer 13.

This rib waveguide 11 is arranged facing the gain medium 3 and is composed of a slab waveguide 15 equipped with a longitudinal rib 17 (see FIGS. 2 and 3A). The slab waveguide 15 and the longitudinal rib 17 are for example both formed from crystalline silicon.

However, other options are possible. A first case in which the slab waveguide 15 is made of crystalline silicon and the longitudinal rib 17 is made of amorphous silicon will in particular be noted.

According to a second particularly advantageous case, the longitudinal rib 17 is made of crystalline silicon and the slab waveguide 15 is formed by two layers, the layer making contact with the longitudinal rib 17 also being made of crystalline silicon and the other, which is proximal to the gain medium 3, being made of amorphous silicon, i.e. the layer that is closest to the gain medium 3. The longitudinal rib 17 and the layer made of crystalline silicon of the slab waveguide 15 are in the silicon-on-insulator (SOI) layer 13 whereas the layer made of amorphous silicon is located in an insulating layer above the silicon-on-insulator layer. This arrangement allows a maximal compatibility with existing front-side silicon photonic processes and devices to be retained and the thermal budget applied to the amorphous silicon layer to be minimised.

Seen in cross section (FIG. 2), the slab waveguide 15 and the longitudinal rib 17 are both rectangular, but their width may vary in the direction of propagation of the light (example in FIG. 4). The optical rib waveguide 11 is oriented so that a Bragg grating 19 is produced on that side 21 of the slab waveguide 15 which is proximal relative to the optical gain medium 3. The term "proximal" is here understood to mean that the Bragg grating 19 is produced on that side 21 which is closest to the gain medium 3, thereby allowing more efficient optical coupling between the Bragg grating 19 on the one hand and the gain medium 3 on the other hand. The reflectivity of the Bragg grating may be comprised between 65% and 80%. For a DFB grating of 500 µ/1 mm length, a feedback coupling coefficient comprised between 10 and 30 cm$^{-1}$ is required. For a bonding thickness of 100 nm, the grating will have to be etched to at least 100 nm in the slab, and the width ($L_A$) of the rib will possibly be smaller than 500 nm.

The longitudinal rib 17 arranged under the slab waveguide 15 (as shown in FIGS. 1 to 4) is distal relative to the gain medium 3. The term "distal" is here understood to mean that the rib 17 is arranged on the side 23 opposite the side 21: the side 23 is furthest from the gain medium 3.

This may also clearly be seen in FIG. 3A, which shows the rib waveguide 11 alone.

As may be seen in FIG. 3A, the width $L_B$ of the Bragg grating 19 is larger than the width $L_A$ of the rib. In particular, the width $L_B$ of the Bragg grating 19 is equal to the width of the slab waveguide 15.

By virtue of these arrangements, the coupling between the Bragg grating 19 and the gain medium 3 is improved.

In addition, it is possible to choose the width $L_B$ of the Bragg grating 19 independently of the width $L_A$ of the rib and without influencing the reflectivity of the Bragg grating 19.

Figure 3B:
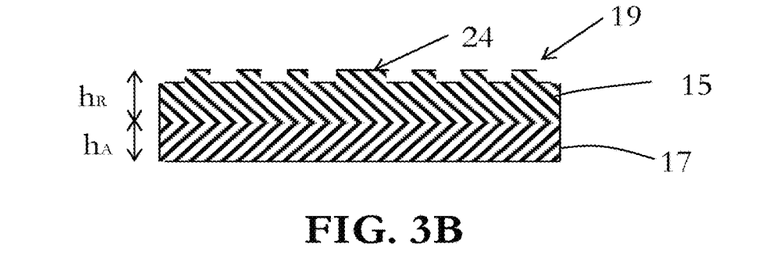
FIG. 3B shows a schematic longitudinal cross-sectional representation of the rib waveguide of the laser device in FIG. 1.

FIG. 3B shows a schematic longitudinal cross-sectional view (in the direction of propagation of the light) of the rib guide 11.

The Bragg grating 19 comprises a quarter-wave plate 24 located at the centre of the grating 19 in order to ensure a single-mode operation of the laser device 1.

The height $h_A$ of the rib is comprised between 100 nm and 250 nm, in particular 200 nm.

The height $h_R$ of the slab guide 15 is comprised between 250 nm and 350 nm, in particular 300 nm.

Reference is now made to FIG. 4, which shows a partial top view of the laser device in FIG. 1.

In particular, the shape of the rib 17, which widens in the direction of an output waveguide 25 in order to form a mode converter, is shown by the dotted lines.

The minimum width $I_{min}$ of the rib 17 is comprised between 0.4 µm and 0.7 µm.

The maximum width $I_{max}$ of the rib 17 is larger than 1 µm, especially 1.1 µm and may be as large as 3 µm.

Reference is now made to FIGS. 1 and 4. As may be seen in these figures, the laser device 1 furthermore comprises an output grating 27.

This grating 27 for coupling to an optical fibre 29 may comprise a series of trenches partially produced in the waveguide 11, for example by etching the latter. Preferably, the trenches are substantially perpendicular to the longitudinal axis of the waveguide 11, and are formed on a lower side of the waveguide 11, the lower side 31 being in FIG. 1 that side of the waveguide 11 which is oriented downwards and substantially parallel to the plane of the waveguide 11.

For a waveguide 11 having the aforementioned dimensions, the trenches may have a depth of 125 nm, or even more if necessary. The grating may, for example, be defined using a hard mask, then a directional etch.

Moreover, eutectic deposits 33 and 35, deposited on the first doped layer 7 and the second doped layer 9, respectively, allow metal contacts to be formed on the layers 7 and 9.

Figure 5A:
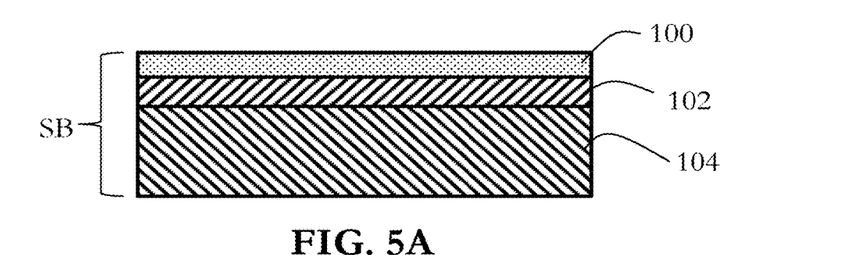
FIGS. 5A, 6A/6B to 14A/14B show schematic cross-sectional views illustrating a process for fabricating a laser device according to the invention, the figures "A" being schematic longitudinal cross-sectional views whereas the figures "B" are corresponding transverse cross-sectional views.
Figure 6A:
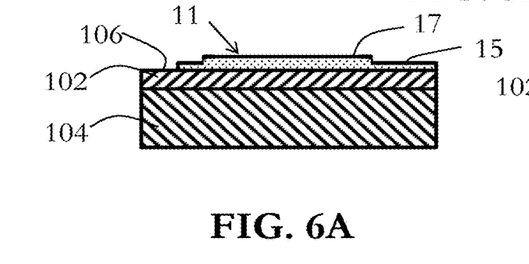

With reference to FIGS. 5, 6A/6B to 14A/14B a process for fabricating a laser device 1 according to the invention will now be described.

FIGS. 5A, 6A/6B to 14A/14B show schematic cross-sectional views, the figures "A" being schematic longitudinal cross-sectional views whereas the figures "B" are corresponding transverse cross-sectional views.

As may be seen in FIG. 5A, the reference SB designates a silicon-on-insulator (SOI) substrate of a wafer.

This SOI substrate comprises a silicon layer or film 100 for example having a thickness comprised between 200 nm and 1 µm, typically of 500 nm, and arranged above a buried insulating layer 102, commonly designated a BOX (for Buried Oxide). This buried insulating layer 102 is itself arranged above a carrier substrate 104.

Figure 6B:
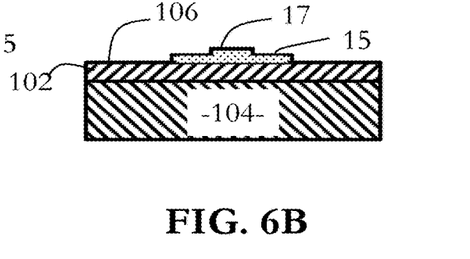

In a first step shown in FIGS. 6A and 6B, the silicon layer 100 is structured, for example by etching, in order to obtain a rib waveguide 11. If the laser device 1 forms part of a larger functional assembly, other components (modulators, photodetectors, etc.) may be produced in this step on the upper side 106 of the BOX layer 102.

Figure 7A:
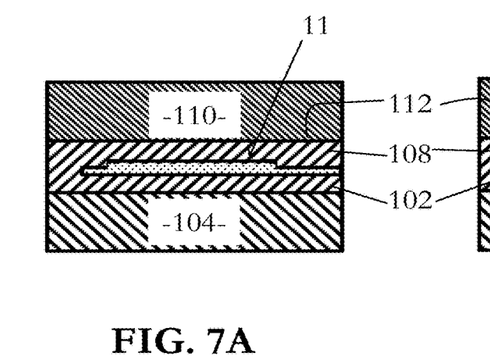
Figure 7B:
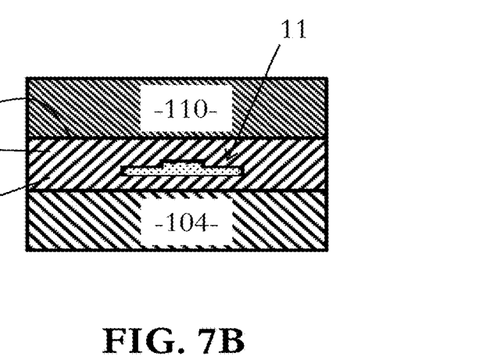
Figure 8A:
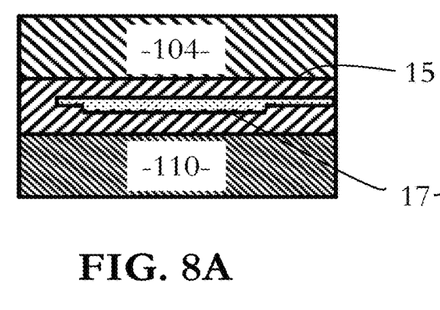
Figure 8B:
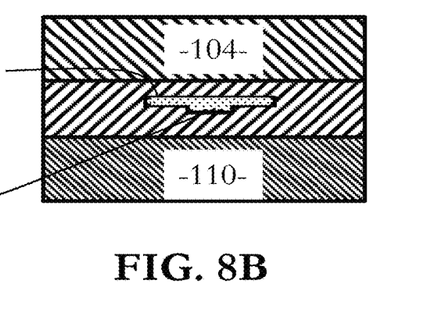
Figure 9A:
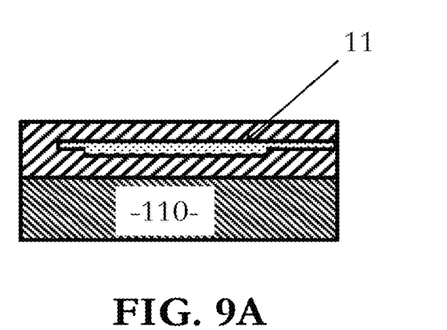
Figure 9B:
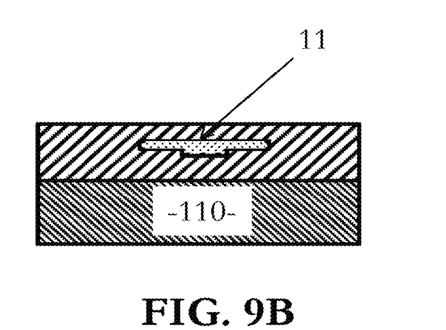

As may be seen in FIGS. 7A and 7B, an insulating layer 108, for example of SiO$_2$, is deposited to encapsulate the rib waveguide 11. Then a carrier substrate 110 is bonded to the upper face 112 of the insulating layer 108.

In the next step (FIGS. 8A and 8B), the assembly is flipped so that the rib 17 is directed downwards in the figure and the slab guide 15 is located thereabove.

The carrier substrate layer 104 is then removed for example by grinding or chemical-mechanical polishing. The top of the BOX layer 102 (which may serve as a stop layer for the polishing) is then completely exposed (see FIGS. 9A and 9B).

Figure 10A:
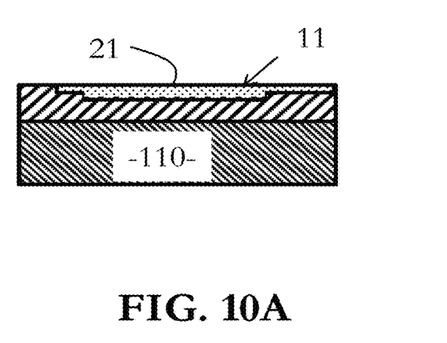
Figure 10B:
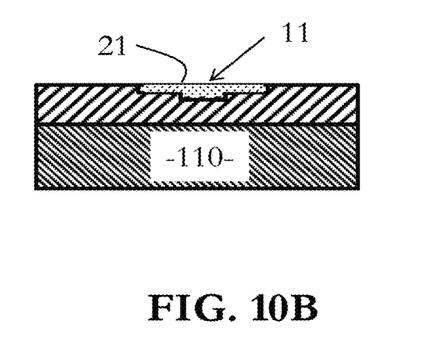
Figure 11A:
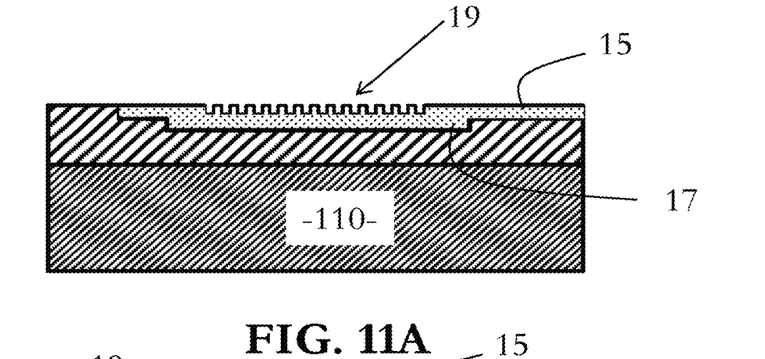
Figure 11B:
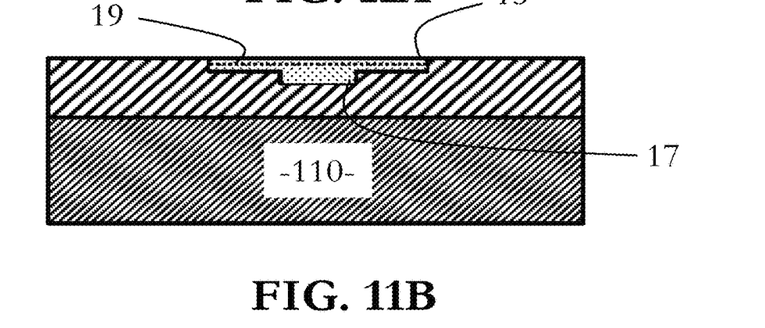

Next, the BOX layer 102 is removed by selective wet chemical etching or by dry etching, for example reactive-ion etching (RIE), or inductively coupled plasma (ICP) etching, so as to expose that side 21 of the slab waveguide 15 which will be turned, as will be seen below, toward the gain medium 3 (see FIGS. 10A and 10B).

In the next step (see FIGS. 11A and 11B), which show a first variant, the Bragg grating 19 is etched (or structured) in the side 21 of the silicon layer 100 thus exposed, preferably over the entire width of the slab guide 15.

According to a second variant (not shown), an additional layer of amorphous silicon is deposited on a portion of the slab waveguide and the Bragg grating is etched (or structured) in this additional layer made of amorphous silicon. In this case, the longitudinal rib 17 is therefore made of crystalline silicon and the slab waveguide 15 is formed by two layers, the layer making contact with the longitudinal rib 17 also being made of crystalline silicon and the other, which is proximal to the gain medium 3, being made of amorphous silicon. The longitudinal rib 17 and the layer made of crystalline silicon of the slab waveguide 15 are in the silicon-on-insulator (SOI) layer 13.

This makes it possible to retain a maximal compatibility with existing processes and photonic devices made of silicon (for example modulators or photodetectors) and to minimise the thermal budget applied to the amorphous silicon layer.

Figure 12A:
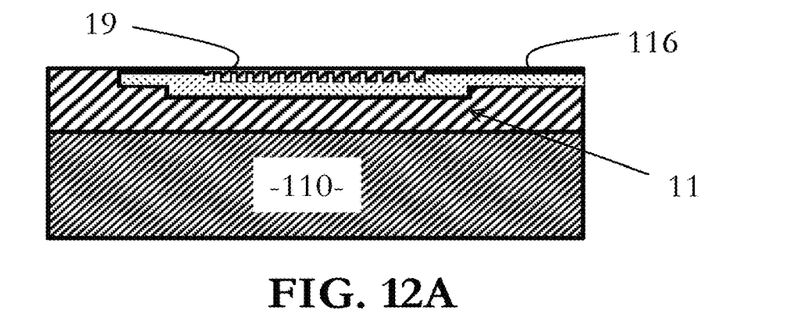
Figure 12B:
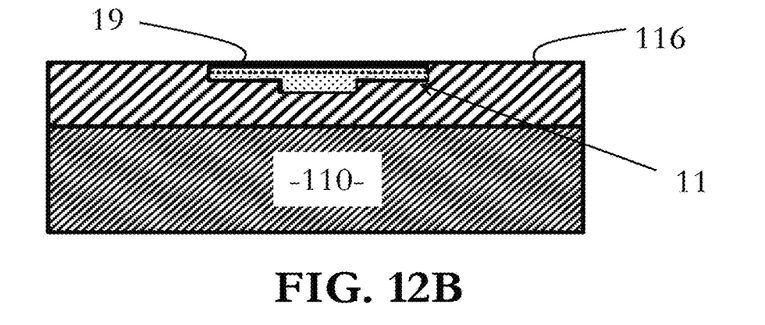
Figure 13A:
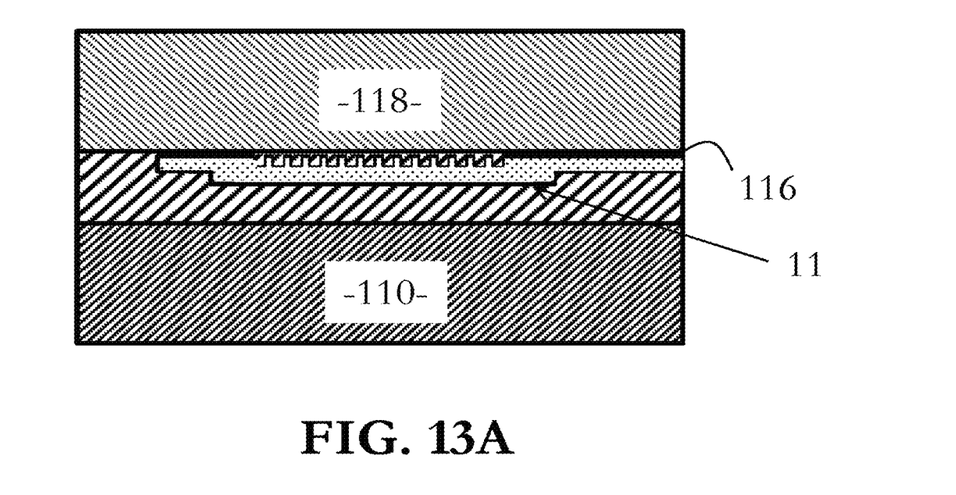
Figure 13B:
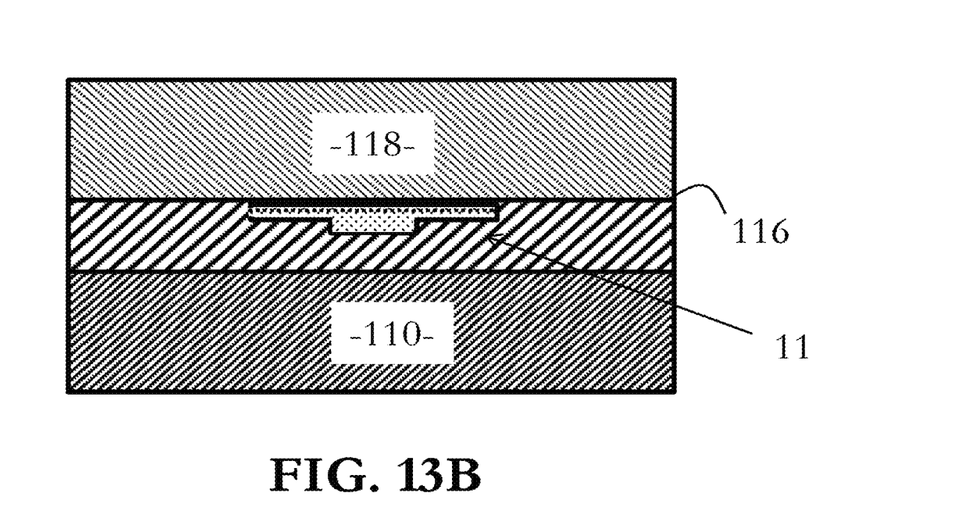

Next, in each and both of the first and second variants, an additional insulating layer 116, for example made of about one hundred nm of SiO$_2$, is deposited on all the side thus exposed (see FIGS. 12A and 12B). It is then possible to subject this additional layer 116 to a chemical-mechanical polish.

Next, a III-V wafer 118 comprising a III-V heterostructure on one side is for example provided. Next, the wafer 118 is bonded, for example by direct bonding, to the additional layer 116 (see FIGS. 13A and 13B), so that the heterostructure makes contact with the structure produced beforehand in the silicon.

Figure 14A:
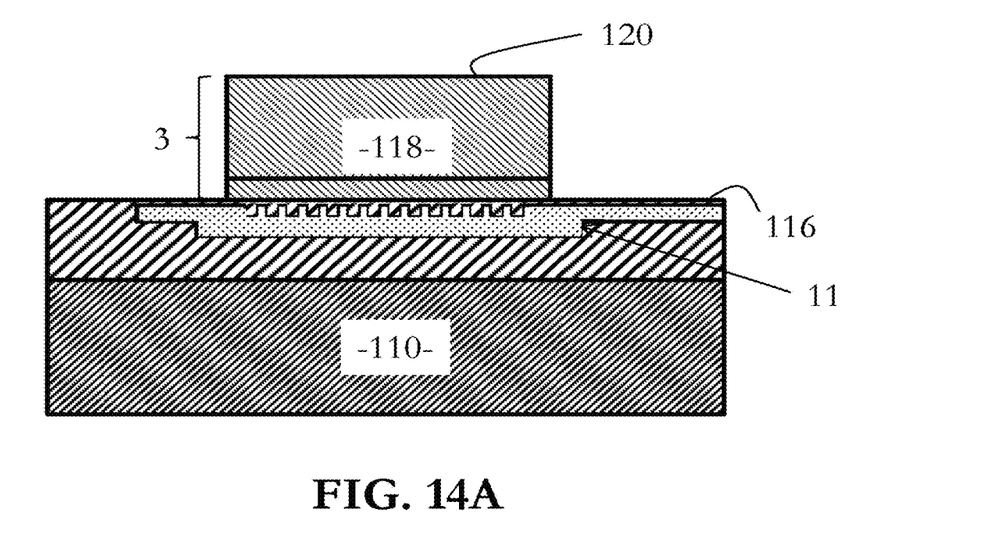
Figure 14B:
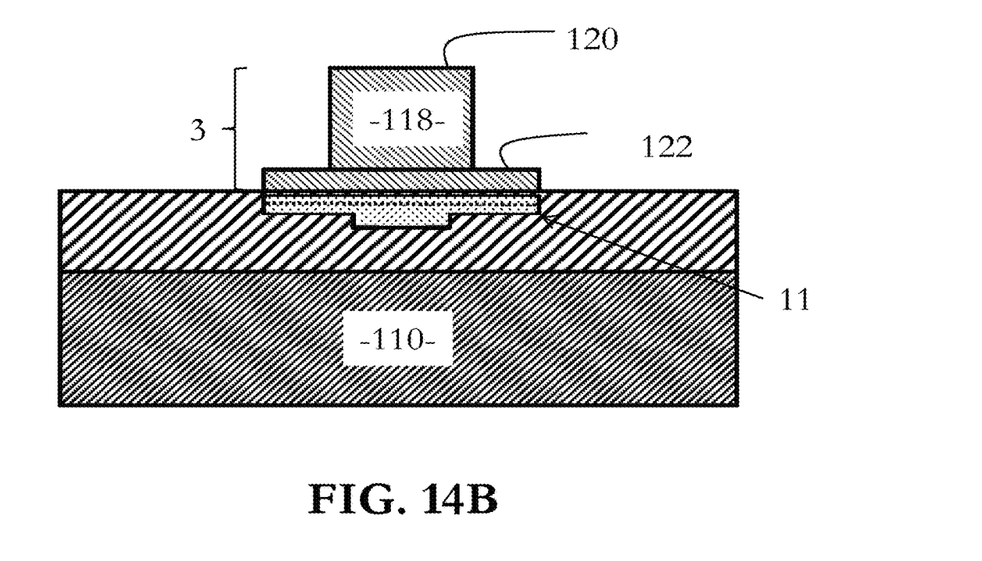
Figure 15:
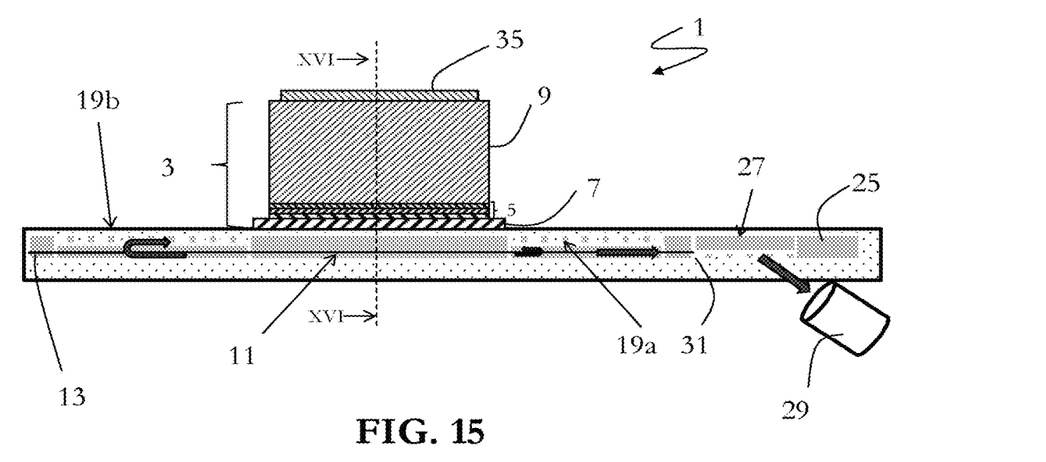
FIG. 15 shows a schematic longitudinal cross-sectional view of second embodiment of a laser device according to invention.
Figure 16:
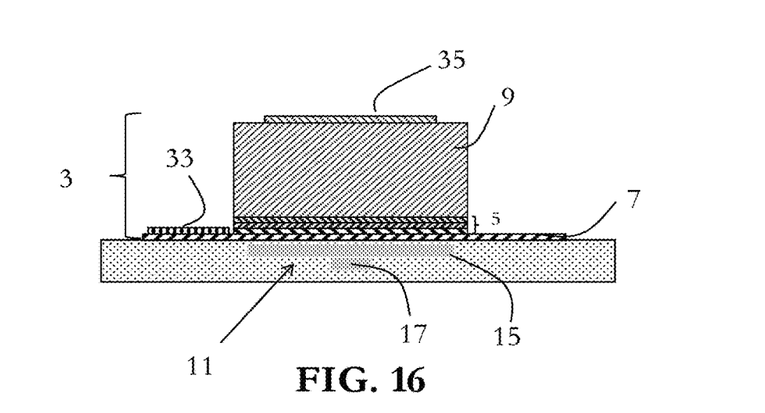
FIG. 16 shows a schematic transverse cross-sectional view along the cross section line XVI-XVI in FIG. 15 of the laser device in FIG. 15.
Figure 17A:
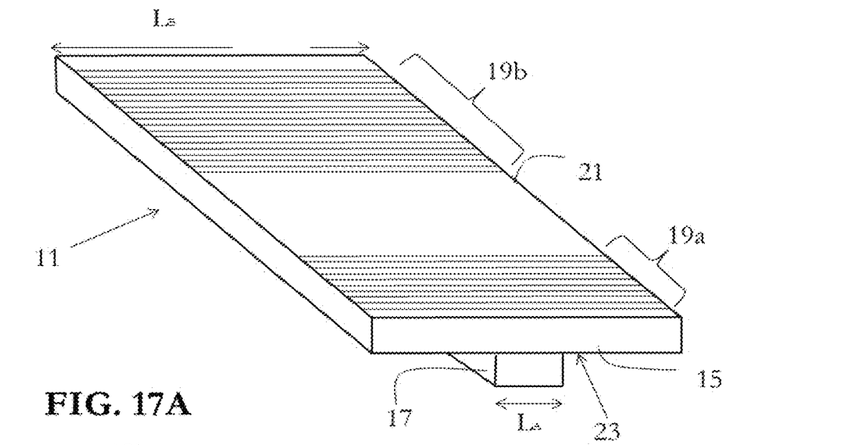
FIG. 17A shows a schematic perspective representation of the rib waveguide of the laser device in FIG. 15.
Figure 17B:
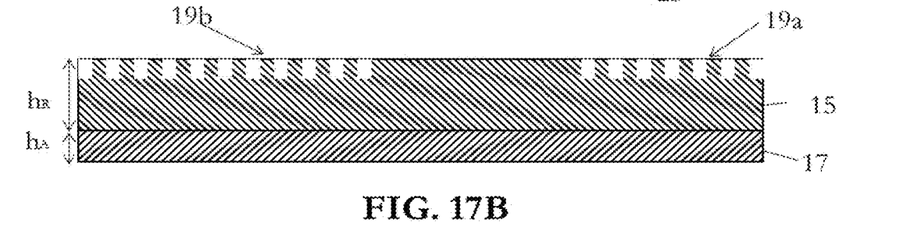
FIG. 17B shows a schematic longitudinal cross-sectional representation of the rib waveguide of the laser device in FIG. 15.
Figure 18:
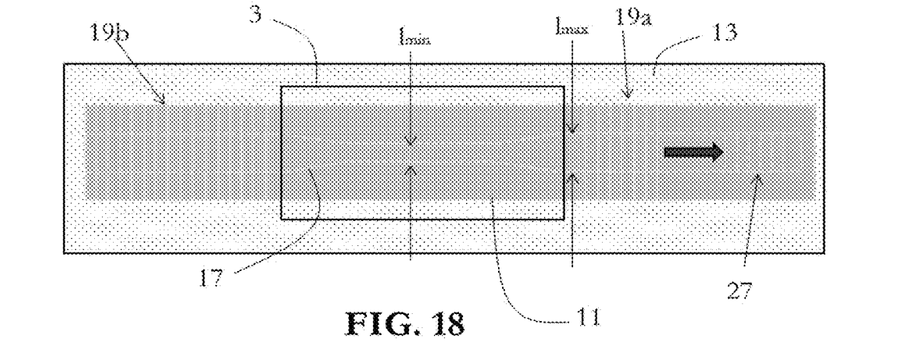
FIG. 18 shows a partial top view of the laser device in FIG. 15.

Lastly, the substrate of the bonded wafer 118 is selectively chemically etched so as to obtain the gain medium 3 (see FIGS. 14A and 14B). For the sake of simplicity, the layers 9, 5 and 7 of the medium 3 have not been shown.

It is then possible to produce eutectic deposits, for example based on gold, so as to make it possible to form metal contacts on the etched layers 120 and 122.

The assembly may then be encapsulated by depositing another insulating layer, and metal contacts may be produced in the conventional way.

FIGS. 15 to 18 show a second embodiment of a laser device 1 according to the invention. In this embodiment, it is a question of a distributed Bragg reflector laser device.

FIGS. 15 to 18 are analogous views to those in FIGS. 1 to 4 and the laser device in FIGS. 15 to 18 differs in that it comprises two Bragg gratings 19a and 19b arranged on either side of the III-V heterostructure gain medium 3. The gratings 19a and 19b are therefore produced in the side 21 that is proximal relative to the gain medium 3, but outside the footprint of this gain medium 3 and in a location where the rib 17 is widest ($l_{max}$).

As may be seen in FIGS. 15, 17A, 17B and 18, the grating 19a that is located on the same side as the output grating 27 is shorter and possesses a lower reflectivity, of about 50%, than the grating 19b on the side opposite the gain medium 3, which for its part possesses a reflectivity higher than 90% or even approaching 100%.

The fabrication process described with relation to FIGS. 5, 6A/6B to 14A/14B applies analogously to the fabrication of a distributed Bragg reflector laser device according to this embodiment.

It may therefore be seen that the laser device 1 according to the invention may be produced easily with a small number of fabrication steps.

Due to the arrangement of the rib waveguide 11, especially in the configuration in FIGS. 1 to 4, the values of the coupling coefficient of the feedback of the Bragg grating 19 on the proximal side of the slab guide 15 are observed to be higher than in the prior art, especially relative to a configuration in which the Bragg grating is structured in the rib.

Moreover, the inventors have also observed a decrease in the influence of the etch depth on the value of the feedback coupling coefficient, thus increasing the robustness of the fabrication process.

The invention claimed is:

1. A III-V heterostructure laser device arranged in and/or on a silicon substrate, comprising:
   a III-V heterostructure gain medium being integrated on the silicon substrate; and
   an optical rib waveguide, arranged facing the gain medium and comprising a slab waveguide equipped with a longitudinal rib, the optical rib waveguide being arranged in the silicon substrate;
   wherein the optical rib waveguide is oriented so that a Bragg grating is arranged on a side of the slab waveguide and is directly beneath and facing the III-V heterostructure gain medium and which is proximal relative to the gain medium without being arranged on a side of the slab waveguide that is distal relative to the gain medium, and in that the longitudinal rib is placed on the side of the slab waveguide that is distal relative to the gain medium.

2. The laser device according to claim 1, wherein the Bragg grating comprises a quarter-wave plate in order to ensure a single-mode operation.

3. The laser device according to claim 1, wherein the reflectivity of the Bragg grating is comprised between 65% and 80%.

4. The laser device according to claim 1, wherein the width of the longitudinal rib of the rib waveguide increases in the direction of an output waveguide in order to form a mode converter.

5. The laser device according to claim 4, wherein the minimum width of the longitudinal rib is comprised between 0.4 μm and 0.7 μm.

6. The laser device according to claim 4, wherein the maximum width of the longitudinal rib is larger than 1.1 μm.

7. The laser device according to claim 1, wherein the height of the longitudinal rib is comprised between 100 nm 200 nm.

8. The laser device according to claim 1, wherein the height of the slab guide is comprised between 250 nm and 300 nm.

9. The laser device according to claim 1, wherein the slab waveguide and the longitudinal rib are each formed from crystalline silicon or one from crystalline silicon and the other from amorphous silicon.

10. The laser device according to claim 1, wherein the longitudinal rib is made of crystalline silicon and the slab waveguide is formed by two layers, the layer making contact with the longitudinal rib also being made of crystalline silicon and the other, which is proximal to the gain medium, being made of amorphous silicon.

11. The laser device according to claim 1, wherein the III-V heterostructure gain medium is wider than the optical rib waveguide in a direction transverse to the propagation direction of light in the waveguide.

* * * * *